United States Patent
Hosek et al.

(10) Patent No.: US 7,245,989 B2
(45) Date of Patent: Jul. 17, 2007

(54) THREE-DEGREE-OF-FREEDOM PARALLEL ROBOT ARM

(75) Inventors: Martin Hosek, Lowell, MA (US); Michael Valasek, Palmetova (CZ)

(73) Assignee: Brooks Automation, Inc., Chelmsford, MA (US)

(*) Notice: Subject to any disclaimer, the term of this patent is extended or adjusted under 35 U.S.C. 154(b) by 705 days.

(21) Appl. No.: 10/741,146

(22) Filed: Dec. 19, 2003

(65) Prior Publication Data
US 2004/0199287 A1    Oct. 7, 2004

Related U.S. Application Data

(60) Provisional application No. 60/435,556, filed on Dec. 20, 2002.

(51) Int. Cl.
*G06F 19/00*    (2006.01)

(52) U.S. Cl. ............... 700/245; 700/247; 700/248; 700/249; 700/256; 700/258; 700/259; 700/264; 318/568.11; 600/102; 600/130; 600/205; 901/1; 901/2; 901/9

(58) Field of Classification Search ............... 700/245
See application file for complete search history.

(56) References Cited

U.S. PATENT DOCUMENTS

| | | | | |
|---|---|---|---|---|
| 5,237,887 A | * | 8/1993 | Appleberry | 74/490.03 |
| 6,675,069 B2 | * | 1/2004 | Uratani | 700/245 |
| 7,039,501 B2 | * | 5/2006 | Freeman et al. | 700/258 |
| 7,057,711 B2 | * | 6/2006 | del Puerto et al. | 355/75 |
| 7,107,125 B2 | * | 9/2006 | Yim et al. | 700/245 |

* cited by examiner

*Primary Examiner*—Thomas Black
*Assistant Examiner*—McDieunel Marc
(74) *Attorney, Agent, or Firm*—Perman & Green, LLP; Richard Pickreign

(57) ABSTRACT

A robot arm includes a drive assembly and an articulated arm assembly pivotally connected to the drive assembly. The articulated arm includes a pivoting base link system, a wrist link system, and a first elbow link system rotatably connected to the base link system by a pair of upper arms and connected to the wrist link system by a pair of forearms, a second elbow link system rotatably connected to the base link system by another at least one upper arm and connected to the wrist link system by another at least one forearm, wherein the drive assembly is connected to at least one of the upper arms and the base link system to provide three degrees of freedom by driving the at least one of the upper arms and pivoting the pivoting base link system to position the wrist link system at a given location with a predetermined skew relative to an axis of translation.

7 Claims, 9 Drawing Sheets

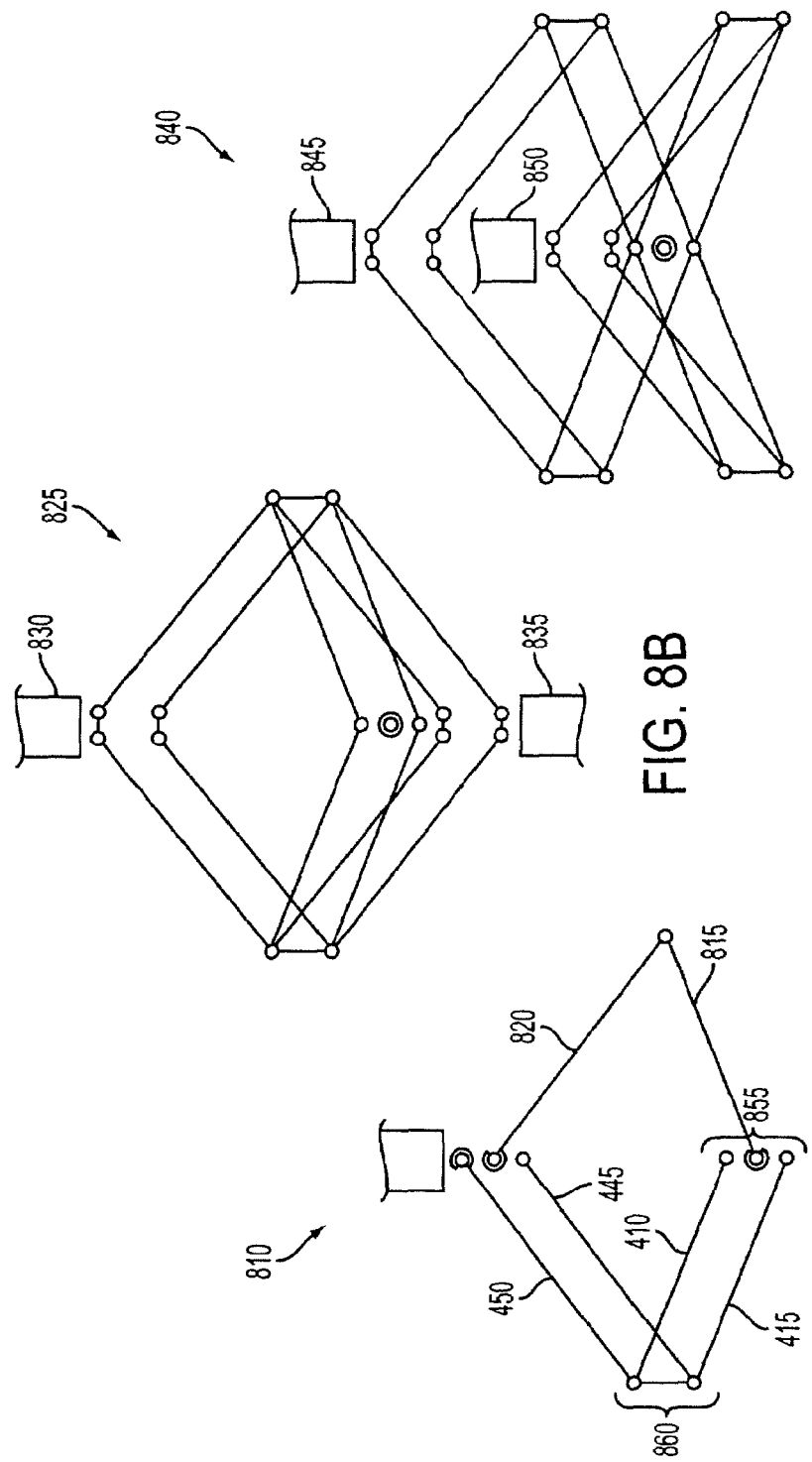

THREE-DEGREE-OF-FREEDOM PARALLEL ROBOT ARM

This application claims the benefit of U.S. Provisional Application No. 60/435,556, filed Dec. 20, 2002.

BACKGROUND OF THE INVENTION

1. Field of the Invention

The present invention relates to transport mechanisms and, more particularly, to a robot arm transport device.

2. Brief Description of Related Developments

The existing manufacturing technologies for semiconductor integrated circuits (IC) and flat panel displays (FPD) include processing of silicon wafers or glass panels, referred to as substrates, in fully automated vacuum cluster tools. A typical cluster tool is shown in FIG. 1 and may include a circular vacuum chamber with radially connected load locks and process modules arranged in a star pattern.

The tool may be serviced by a robot which is located at the center of the chamber, and cycles the substrates from the load locks through the process modules and back to the load locks. Another robot may be located in an atmospheric transfer module which serves as an interface between the load locks of the vacuum chamber and standardized load ports serviced by an external transportation system.

Typical operations performed by the vacuum robot include rotational and radial straight-line moves in a horizontal plane. In order to position the substrate to a given point in the plane of operation, the robot arm needs to be capable of a planar motion with two degrees of freedom. Since the load locks and process modules, also referred to as robot stations, are connected radially to the chamber, the orientation of an end-effector of the arm needs to be kept radial regardless of the position of the robot arm. Typical arm designs that provide such a functionality include telescoping, scara-type, and frog-leg mechanisms. FIG. 2 shows an exemplary telescoping arm 200a, an exemplary scara arm 200b, and an exemplary frog-leg arm 200c. In many applications, the robot includes a vertical lift drive which provides an additional DOF required to pick/place substrates from/to fixed pins, and for servicing stations at different vertical levels.

The drawbacks of the star configuration of the cluster tool chamber include a relatively large footprint and inconvenient interface geometry. In response to the growing demand for footprint reduction and standardized factory interface, tools with stations arranged in a non-radial manner are being introduced. An example of such an arrangement is the atmospheric transfer module of the cluster tool of FIG. 1. In order to access non-radial (orthogonal) stations properly, the atmospheric robot needs to be capable of moving and positioning the end-effector to a given point with a specified orientation, i.e., providing three degrees of freedom (3DOF) in the plane of operation.

A typical example of such a 3DOF robot may be a planar three-link manipulator comprising an upper arm, forearm and end-effector that are coupled and actuated through revolute joints, as shown in FIG. 3. An alternative four-link design is described in U.S. Pat. No. 5,789,890, issued Aug. 4, 1998, to Genov et al. Typically, the end-effector is driven by a motor located at the robot wrist joint 300a (FIG. 3), or through a multiple-stage belt arrangement from an actuator installed inside the robot arm 300b (FIG. 3) or in the robot base 300c (FIG. 3).

The multiple-stage belt arrangements of 300b and 300c add to the mechanical complexity of the robot arm, present a reliability risk, complicate manufacturing and maintenance of the arm, and produce particles which may leak outside and contaminate the workspace of the robot. The approach of 300a eliminates the drawbacks of multiple belt stages, but the actuator at the wrist joint adds mass to the moving components of the robot, thus limiting the speed of motion and increasing the overall power requirements. In addition, the power and signal lines routed through the moving components of the robot arm often represent significant cost and reliability concerns. This approach is particularly problematic in vacuum applications due to sealing and heat removal issues.

SUMMARY OF THE INVENTION

The present invention is directed to a robot arm A robot arm includes a drive assembly and an articulated arm assembly pivotally connected to the drive assembly. The articulated arm includes a pivoting base link system, a wrist link system, and a first elbow link system rotatably connected to the base link system by a pair of upper arms and connected to the wrist link system by a pair of forearms, a second elbow link system rotatably connected to the base link system by another at least one upper arm and connected to the wrist link system by another at least one forearm, wherein the drive assembly is connected to at least one of the upper arms and the base link system to provide three degrees of freedom by driving the at least one of the upper arms and pivoting the pivoting base link system to position the wrist link system at a given location with a predetermined skew relative to an axis of translation.

BRIEF DESCRIPTION OF THE DRAWINGS

The foregoing aspects and other features of the present invention are explained in the following description, taken in connection with the accompanying drawings, wherein:

FIG. 8a shows an asymmetric arm embodiment of the present invention; and

FIGS. 8b and 8c show exemplary embodiments of dual end-effector configurations of the present invention.

DETAILED DESCRIPTION OF THE PREFERRED EMBODIMENT(S)

Figure 1:
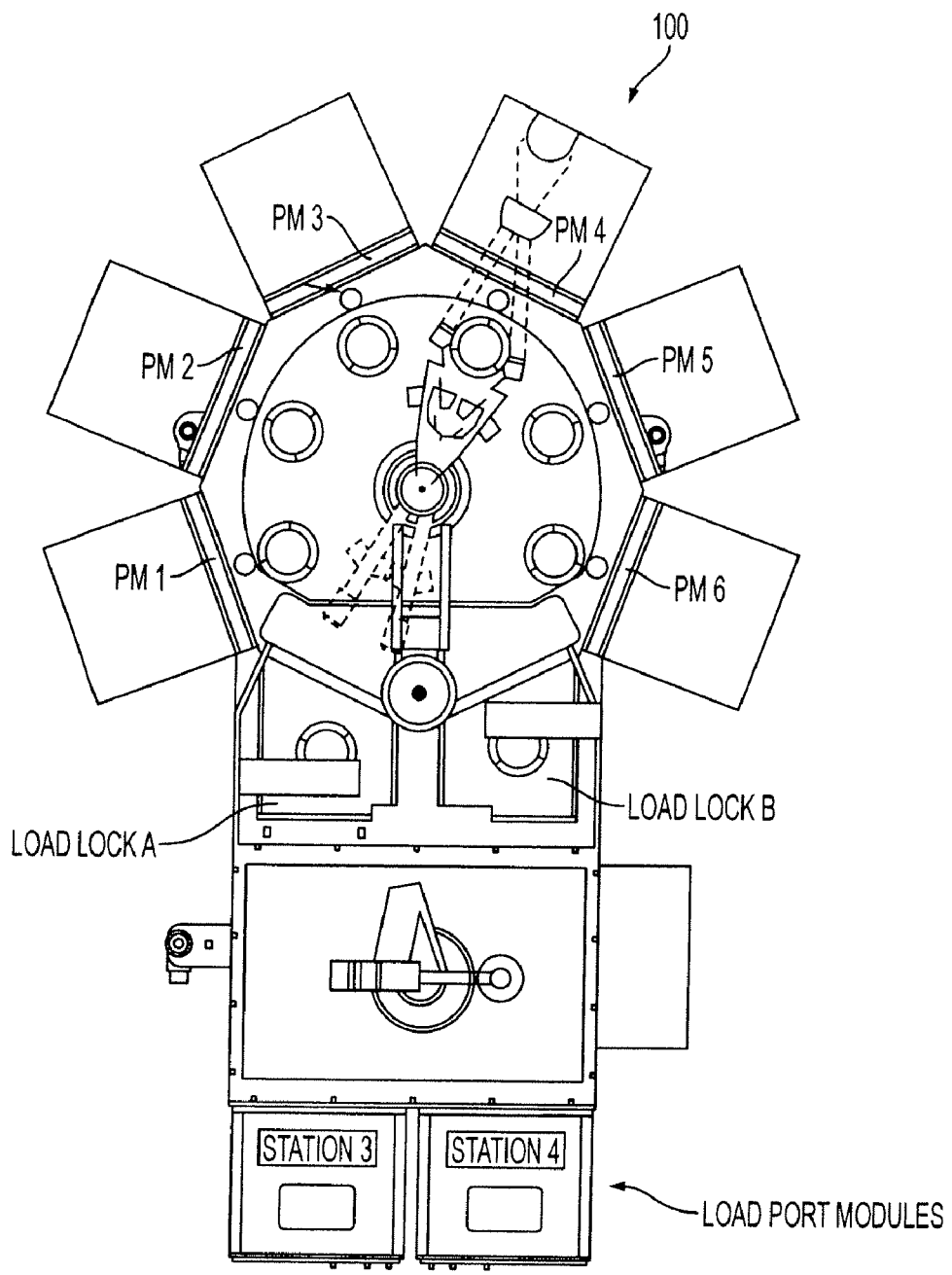
FIG. 1 shows a typical cluster tool.
Figure 2:
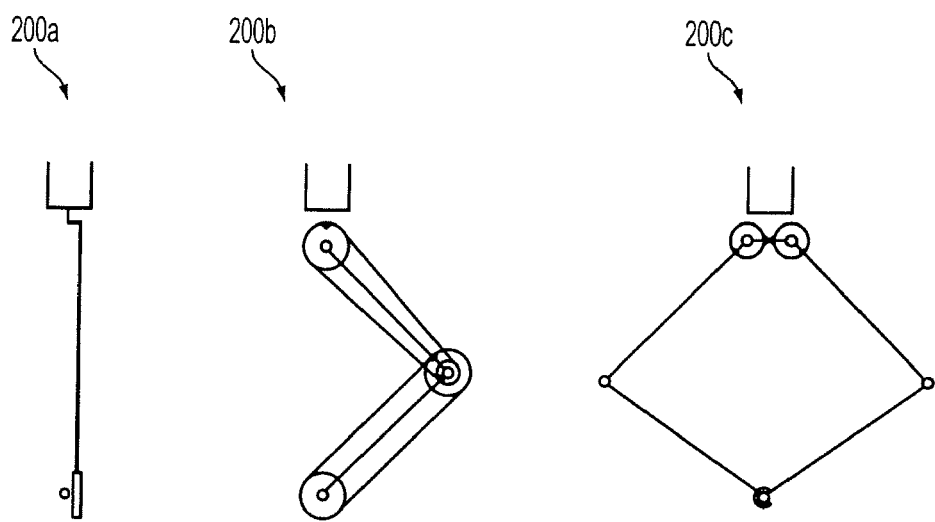
FIG. 2 shows an exemplary telescoping arm, an exemplary scara arm, and an exemplary frog-leg arm.
Figure 3:
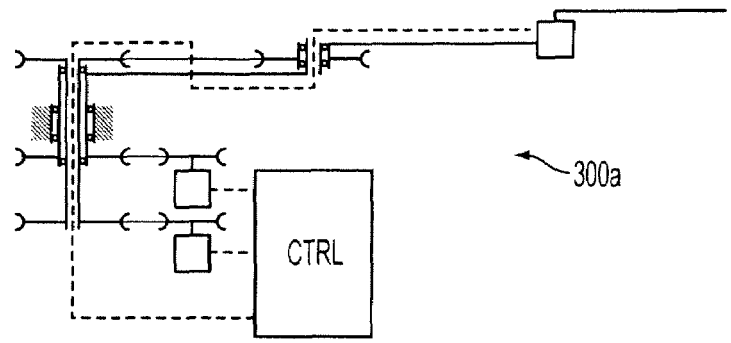
FIG. 3 shows typical examples of a planar three-link manipulator.
Figure 3:
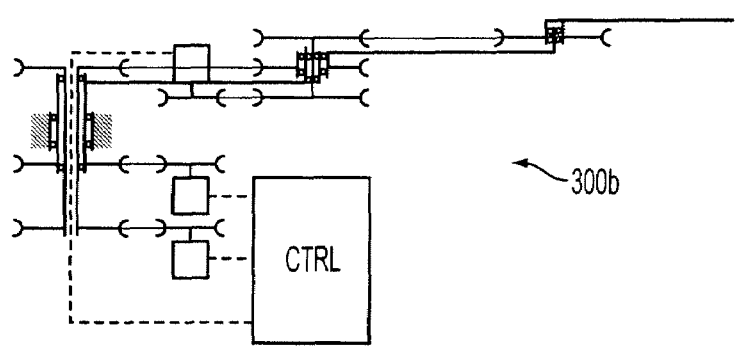
Figure 3:
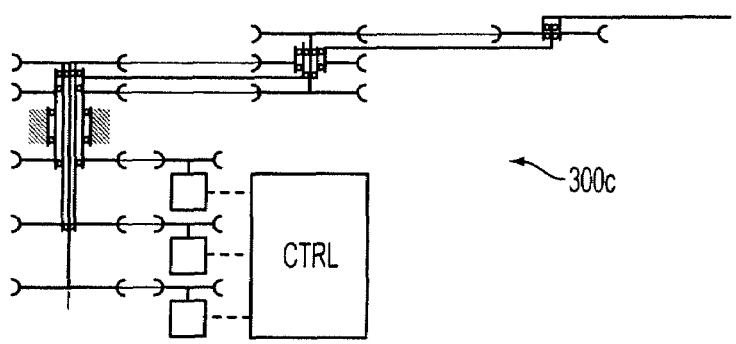
Figure 4:
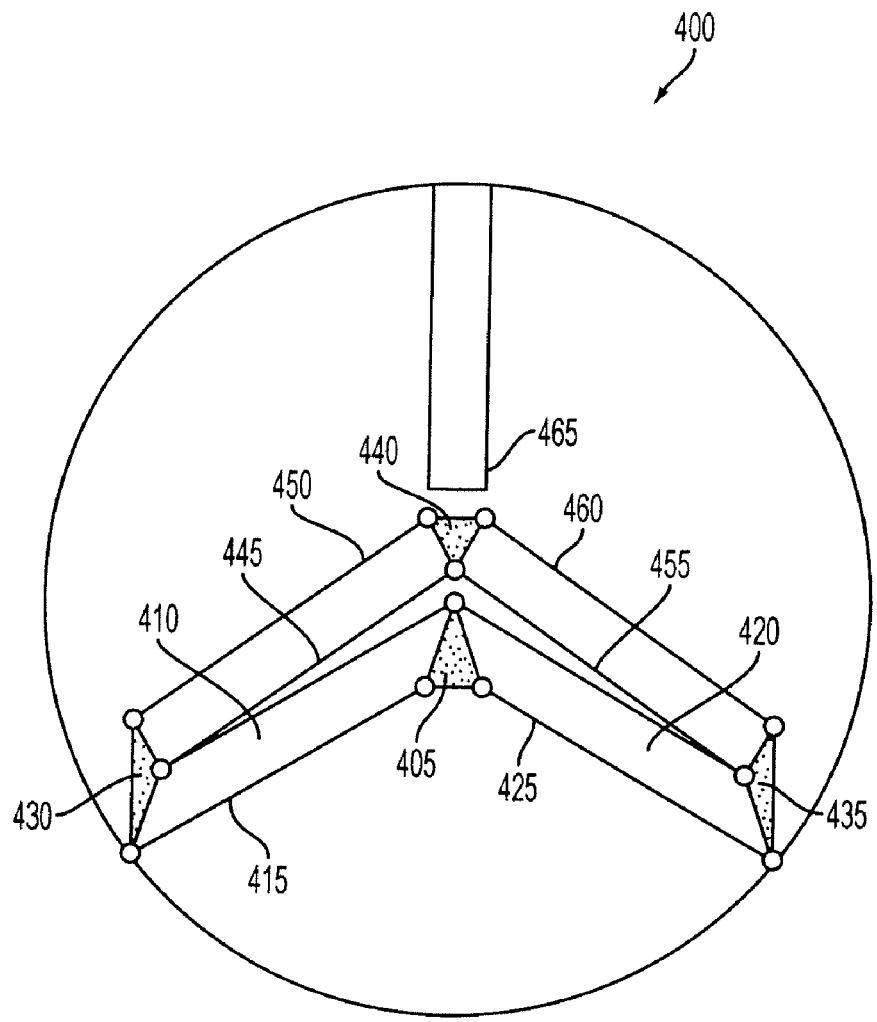
FIG. 4 shows one embodiment of a parallel arm according to the present invention.

Referring to FIG. 4, one embodiment incorporating features of the present invention is illustrated. Although the present invention will be described with reference to the embodiment shown in the drawings, it should be understood that the present invention can be embodied in many alternate forms of embodiments. In addition, any suitable size, shape or type of elements or materials could be used.

The disclosed embodiments are directed to a 3DOF robot arm that includes a pivoting base platform, two elbow platforms and a wrist platform, which are connected by two symmetric pairs of parallelogram mechanisms. Each disclosed embodiment herein may be referred to as a "parallel arm."

The wrist platform of the parallel arm carries an end-effector, the position and angular orientation of which can be controlled independently. The joints and links of the parallel arm are arranged in a unique geometric configuration to provide a usable range of motion. The usable range of motion may include a sufficient range of motion for typical vacuum cluster tools.

In one embodiment, motors that may be used to drive the parallel arm may be located at a stationary base of the robot with no need for joint actuators carried by the arm or complicated belt arrangements running through the arm. As a result, the motors may not contribute to the mass and inertia properties of the moving parts of the parallel arm, power and signal wires through the arm may be eliminated, reliability and maintenance aspects of operation may be improved, and the level of undesirable particle generation may be reduced.

One embodiment of the parallel arm having a single end effector is depicted diagrammatically in FIG. 4. The single end effector embodiment 400 may include a pivoting base platform 405 which is coupled to four links, referred to as the left inner upper arm 410, left outer upper arm 415, right inner upper arm 420 and right outer upper arm 425. The links may be coupled at one end to the base platform 405 through revolute joints. The other ends of the left inner upper arm 410 and left outer upper arm 415 are attached to a left elbow platform 430 in a parallelogram arrangement.

Similarly, the right inner upper arm 420 and right outer upper arm 425 are coupled to a right elbow platform 435 in a parallelogram manner. The left elbow platform 430 is connected to a wrist platform 440 by links referred to as a left inner forearm 445 and a left outer forearm 450 to form another parallelogram, the forearms 445 and 450 being coupled to the platforms 430 and 440.

Likewise, the right elbow platform 435 is connected to the wrist platform 440 through a set of links referred to as a right inner forearm 455 and right outer forearm 460 in a parallelogram manner. Forearms 455 and 460 may be attached to platforms 435 and 440 via revolute joints. The wrist platform 440 may be coupled to an end-effector 465.

All couplings between the platforms and the links may utilize revolute joints or any other type of coupling suitable for performing the functions required by the disclosed embodiments.

Figure 4A:
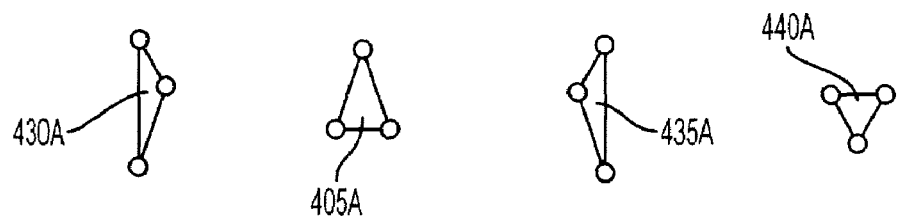
FIG. 4a shows link system elements that may be used in place of platforms as part of the present invention.

One or more of the platforms 405, 430, 435, 440 may be replaced by a three link element system as shown in FIG. 4A. Platforms 405A, 430A, 435A, 440A each include links that form a triangle with a joint at each apex. The joints may be revolute joints or any other type of suitable coupling.

Figure 5C:
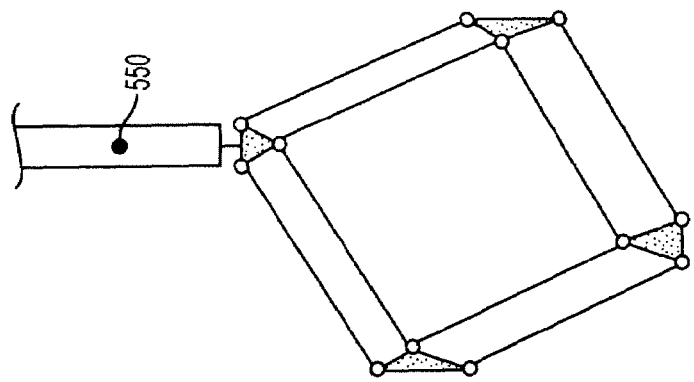
FIG. 5c shows the embodiment of FIG. 4 with the end-effector in a translated position.
Figure 5B:
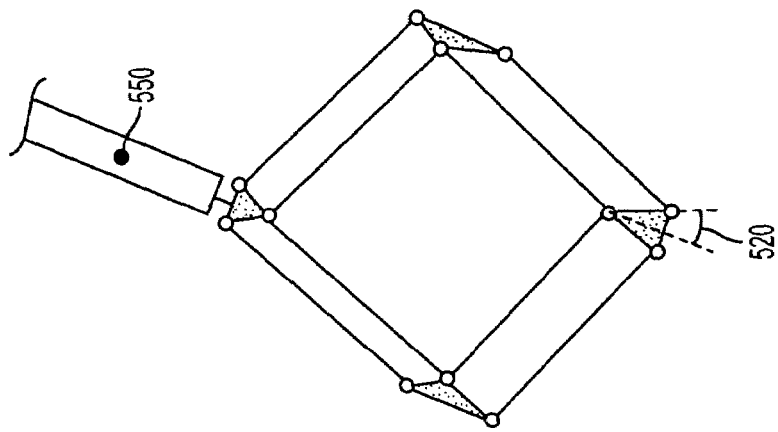
FIG. 5b shows the embodiment of FIG. 4 with the end-effector in a rotated position.
Figure 5A:
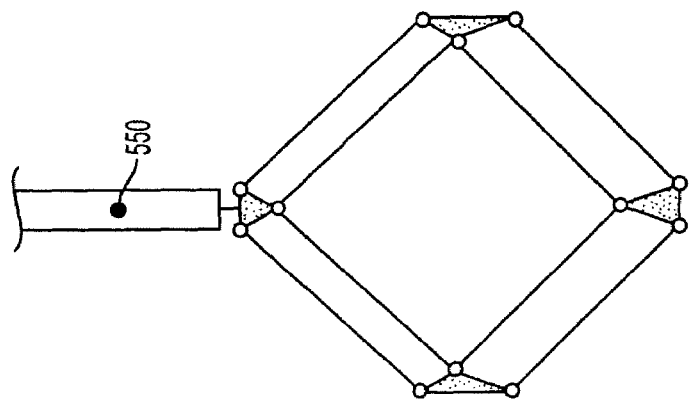
FIG. 5a shows the embodiment of FIG. 4 with the end-effector in an extended position.

FIGS. 5A-5C show examples of the positioning capability provided by the parallel arm embodiment 400 of FIG. 4.

The position of parallel arm 400, or more particularly, wrist platform 440, as shown in FIG. 5A-5C is determined uniquely by three independent coordinates, e.g., $[\theta_O, \theta_L, \theta_R]$, where $\theta_O$ is an angular orientation of the base platform 405, $\theta_L$ is an angular orientation of the left upper arms 410, 415, and $\theta_R$ is an angular orientation of the right upper arms 420, 425, or $[X_E, Y_E, \theta_E]$, where $X_E$ and $Y_E$ are Cartesian coordinates of a selected reference point on the robot end-effector 465, and $\theta_E$ is angular orientation of the robot end-effector 465. Thus, the parallel arm 400 has three degrees of freedom, and is capable of positioning the end-effector 465 to a given location in a plane of operation with a specified angular orientation.

Figure 4B:
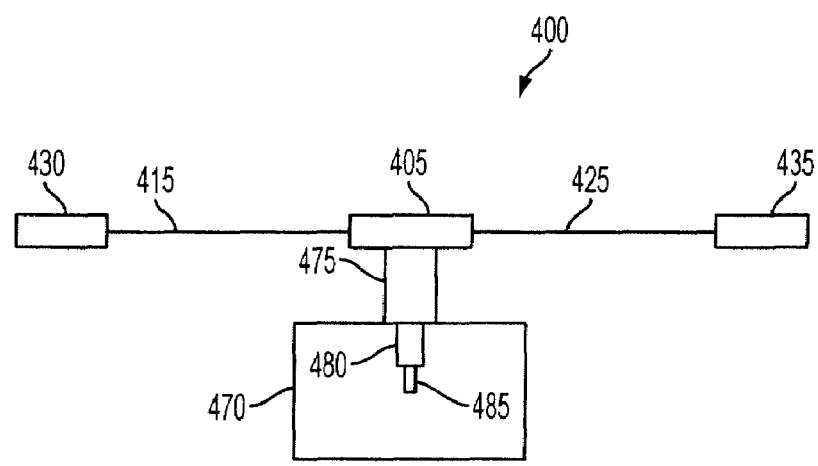
FIG. 4b shows an exemplary drive system for use as part of the present invention.

Parallel arm 400 may be driven by three independent actuators located in a base of the robot. FIG. 4B shows a side view of parallel arm 400, which also includes a drive assembly 470. Drive assembly 470 may support parallel arm 400 and may provide a first actuator 475 to drive at least one of left inner upper arm 410 and left outer upper arm 415, a second actuator 480 to drive base platform 405, and a third actuator 485 to drive at least one of right inner upper arm 420 and right outer upper arm 425. The three actuators may be of any suitable type, including for example, motor drive shafts which may be arranged in a coaxial fashion to rotate about a common axis, driving the base platform 405 and the inner upper arms 410 and 420. In alternate embodiments, drive assembly 470 may include any type of drive assembly or combination of drive assemblies suitable for driving the embodiments described herein.

Parallel arm 400 may be rotated with respect to the pivot point of the base platform 405 by changing the orientations of the platform 405 and the upper arms 410, 415 and 420, 415 equally in the specified direction of rotation. The end-effector 465 of the arm 400 can be extended radially with respect to the pivot point of the base platform 405 by rotating the left upper arms 410, 415 and right upper arms 420, 425 by equal angles 510 in opposite directions, as shown in FIG. 5a.

The orientation of the end-effector 465 can be controlled by rotating the base platform 405 by a specified angle 520, as illustrated in FIG. 5b. A translational motion of the end-effector 465 can be achieved by rotating the left upper arms 410, 415 and right upper arms 420, 425 by generally unequal angles 530, 540, as depicted in FIG. 5c.

A general planar motion of the end-effector 465 can be synthesized conveniently in terms of a combined translation of a reference point 550 on the end-effector 465 and simultaneous rotation of the end-effector 465 with respect to reference point 550.

Figure 6:
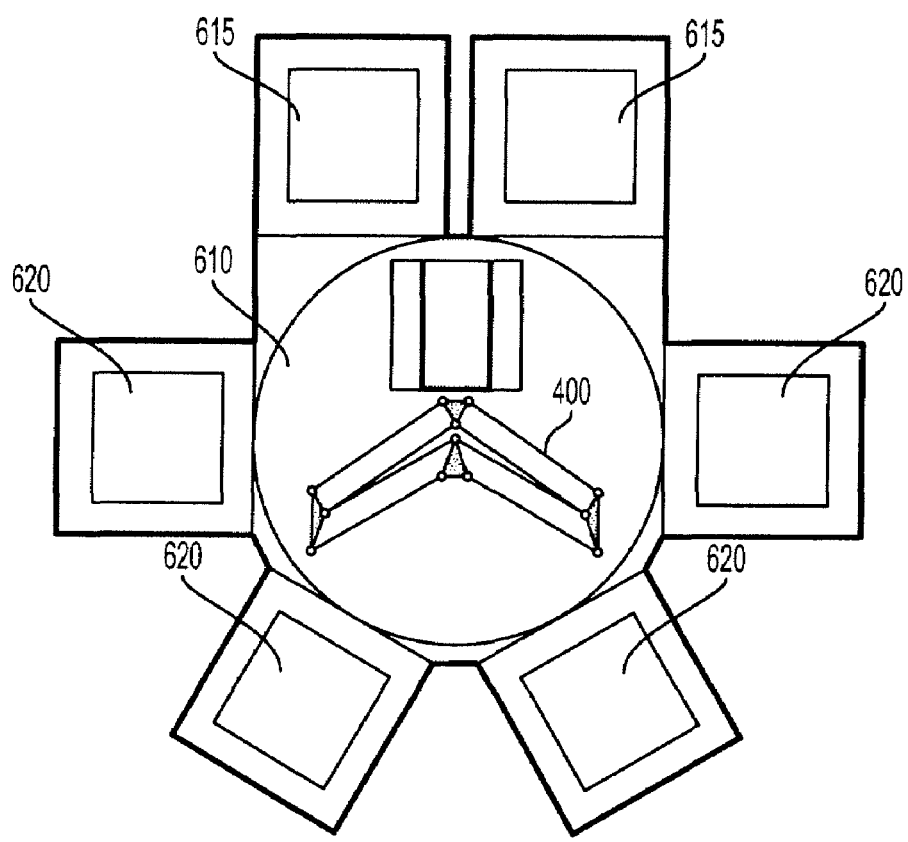
FIG. 6 shows an embodiment of the parallel arm in a retracted position in a vacuum chamber.

Exemplary applications of parallel arm 400 are shown in FIGS. 6 and 7. FIG. 6 depicts parallel arm 400 in a retracted position in a vacuum chamber 610. Two non-radial (orthogonal) stations 615 and four radial stations 620 are connected to the circumference of the chamber 610.

Figure 7B:
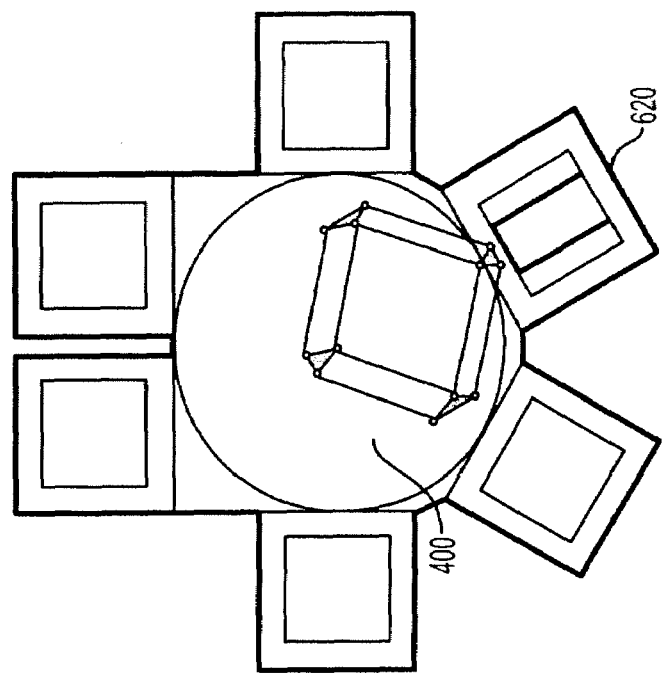
FIG. 7b shows the parallel arm extended into a radial station.
Figure 7A:
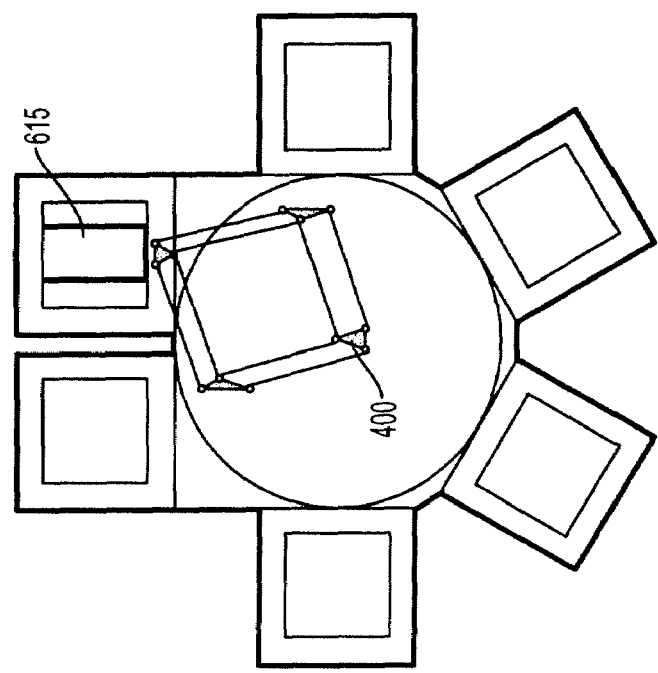
FIG. 7a shows the parallel arm extended into an orthogonal station.

The benefit of the additional degree of freedom of parallel arm 400 is illustrated in FIG. 7a where parallel arm 400 is shown extended into one of the orthogonal stations 615. The capability of accessing radial stations 620 remains preserved, as illustrated by FIG. 7b.

It is important to note that the diagrams of FIG. 4 through FIG. 7 represent kinematic schematics of the present invention. The actual mechanical design of parallel arm 400 may differ substantially from these diagrams as long as the key kinematic properties are preserved. For example, the four platforms 405, 430, 435, 440, upper arms 410, 415, 420, 425, forearms 445, 450, 455, 460, and end-effector 465 may be operable in different horizontal planes for increased range of motion of the revolute joints. To achieve a more compact design, each of the four parallel link pairs 410 415, 420 425, 445 450, 455 460, can be designed in terms of a structural housing acting as one of the links of the parallelogram mechanism with an internal linkage assuming the role of the other link.

The embodiment of FIG. 4 includes two symmetric branches of parallelogram mechanisms. The left branch connects the base platform 405 and the wrist platform 440 through links 410, 415, 445 and 450. The right branch includes links 420, 425, 455 and 460. This over-constrained symmetric configuration includes redundant components and can be simplified by replacing one of the two branches of parallelogram mechanisms by a pair of links connected in series via a single revolute joint. A resulting asymmetric arm embodiment 810 is depicted diagrammatically in FIG. 8a where the right branch of parallelogram mechanisms has been replaced by a simple pair of links 815, 820. This configuration reduces the number of links and joints, which directly translates to lower material and assembly costs. FIG. 8A shows a linear link system 855 where three joints are coupled in line. FIG. 8A also includes a linear link system with two joints 860. Linear link system 855 may be used in the embodiment of FIG. 4 in place of platforms 405 and 440, and linear link system 860 may used in the embodiment of FIG. 4 in place of platforms 430 and 435.

In many applications, a cluster tool robot is required to replace a processed substrate with a fresh substrate in the shortest time possible. This operation, referred to as substrate exchange, often directly affects the throughput performance of a cluster tool, i.e., the number of substrates processed by the tool per hour. In order to complete a substrate exchange operation, a single end-effector robot may perform the following sequence of moves: it picks the processed substrate, retracts back to the vacuum chamber, rotates toward the station where the substrate needs to be placed, extends to the station, places the substrate, retracts back to the vacuum chamber, rotates toward the station where a fresh substrate can be obtained, extends to the station, picks a fresh substrate, retracts back to the vacuum chamber, rotates toward the original station, extends to the station, and places the substrate. The substrate exchange operation may require a total of 13 discrete moves.

The number of moves, and thus the substrate exchange time, can be improved by utilizing a robot with two end-effectors. A two end-effector robot picks the processed substrate by one end-effector and replaces it by a fresh substrate readily available on the other end-effector, thus reducing substantially the number of moves on the critical path.

Exemplary embodiments of dual end-effector configurations of the present invention for rapid substrate exchange operations are shown in FIGS. 8b and 8c. An opposite-side dual end-effector embodiment 825 is depicted schematically in FIG. 8b and comprises two end-effectors 830, 835 which extend in opposite directions.

The retracted position of the arm 825 is typically set so that the angular orientations of the left and right pairs of upper arms are 180 deg apart, which positions the two end-effectors 830, 835 symmetrically with respect to the pivot point of the base platform. Similarly to the single-end-effector configuration, the entire arm 825 can be rotated with respect to the pivot point of the base platform by moving the base platform and the two pairs of upper arms equally in the specified direction of rotation. When the left and right pairs of upper arms rotate by equal angles in opposite directions, one of the end-effectors 830, 835 extends radially while the other one retracts slightly toward the pivot point of the base. The end-effectors 830, 835 exchange their roles when the left and right pairs of upper arms reverse the directions of rotation from the retracted position. Similarly to the single-end-effector case, the orientation of the end-effectors 830, 835 can be controlled by rotating the base platform by a specified angle.

Due to the opposite-side location of end-effectors 830, 835, parallel arm 825 may rotate by 180 deg when performing a substrate exchange operation, which may not be optimal due to the time required for the rotation. However, no mechanical components of parallel arm 825 move above substrates which may be carried by end-effectors 830 and 835, thus reducing the risk of particle contamination of the substrates.

A same-side parallel arm configuration 840 is shown in FIG. 8c where the upper arms are extended beyond their pivot points on the base platform, which makes it possible to install a second set of forearm pairs so that end-effectors 845, 850 point in the same direction in different horizontal planes. The retracted position of the robot arm 840 is typically set so that the angular orientations of the left and right pairs of upper arms are 180 deg apart, which positions the two end-effectors 845, 850 to the same distance from the pivot point of the drive unit, one above the other.

The same-side location of end-effectors 845, 850 enables rapid substrate exchange without rotation of parallel arm 840, thus further reducing the substrate exchange time. Generally, only a small height adjustment may be required to compensate for the vertical distance between the end-effectors 845, 850. However, the risk of particle contamination may increase since one of the end-effectors travels above the other.

Same-side arm 840 can be controlled in a similar manner as the opposite-side configuration 825 and the original mechanism 400 by specifying three angular coordinates, such as the angle of the base platform, the angle of the left pair of upper arms and the angle of the right pair of upper arms, hence preserving the 3DOF nature of the present invention.

Thus, novel embodiments of planar three-degree of freedom (3DOF) parallel robot arms are disclosed which are advantageous for automated pick-place operations in vacuum cluster tools for semiconductor and flat panel display manufacturing applications. The disclosed embodiments generally include devices that can transport and position a payload to a given point in a plane of operation with a specified orientation. The three degrees of freedom of the disclosed embodiments allow for orthogonal tool configurations, resulting in reduced footprint and simplified interface geometry.

The basic single end-effector configuration of the robot arm includes a pivoting base platform, two elbow platforms and a wrist platform, which are connected through two symmetric pairs of parallelogram mechanisms. The wrist platform carries an end-effector, the position and angular orientation of which can be controlled independently by three motors located at the base of the robot. The joints and links of the mechanism are arranged in a unique geometric configuration which provides a sufficient range of motion for typical vacuum cluster tools. In addition to the basic symmetric single end-effector configuration, an asymmetric cost-effective version of the mechanism is derived, and two dual end-effector alternatives for improved throughput performance are described.

In contrast to prior attempts to control angular orientation of the robot end-effector, all of the motors that drive the arm can be located at the stationary base of the robot with no need for joint actuators carried by the arm or complicated belt arrangements running through the arm. As a result, the motors do not contribute to the mass and inertia properties of the moving parts of the arm, no power and signal wires through the arm are necessary, the reliability and maintenance aspects of operation are improved, and the level of undesirable particle generation is reduced. These aspects are particularly important for high-throughput applications in vacuum and particle-sensitive environments.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A robot arm comprising:
    a drive assembly;
    an articulated arm assembly pivotally connected to the drive assembly including:
        a pivoting base link system;
        a wrist link system; and
        a first elbow link system rotatably connected to the base link system by a pair of upper arms and connected to the wrist link system by a pair of forearms,
        a second elbow link system rotatably connected to the base link system by another at least one upper arm and connected to the wrist link system by another at least one forearm,
    wherein the drive assembly is connected to at least one of the upper arms and the base link system to provide three degrees of freedom by driving the at least one of the upper arms and pivoting the pivoting base link system to position the wrist link system at a given location with a predetermined skew relative to an axis of translation.

2. The robot arm of claim 1, wherein the predetermined skew comprises a non-zero angular offset.

3. The robot arm of claim 1, wherein the skew comprises a offset comprises a non-zero linear offset.

4. The robot arm of claim 1, wherein the location of the wrist link system is determined by coordinates $\theta_0$, $\theta_L$, $\theta_R$, where $\theta_0$ is an angular orientation of the base link system, $\theta_L$ is an angular orientation of an upper arm connecting the first elbow link system, and $\theta_R$ is an angular orientation of an upper arm connecting the second elbow link system.

5. The robot arm of claim 1, wherein the pivoting base link system, the wrist link system, and the two elbow link systems are each rigid platforms.

6. The robot arm of claim 1, wherein the wrist link system comprises an end effector.

7. A robot comprising:
    a drive section; and
    an articulated arm having:
        a pair of opposing upper arms connected to the drive section at a shoulder;
        a pair of opposing forearms, each supporting an end effector, each pivotally connected to a corresponding one of the pair of opposing upper arms at an elbow joint and connected to each other at a wrist,
        wherein at least one of the pairs of upper arms comprises a pair of upper arm members extending between the shoulder and a common elbow joint, and at least one of the pair of forearms comprises a pair of forearm members extending from the common elbow joint to the wrist,
        wherein the pair of upper arm members are connected to each other at the shoulder by a shoulder link member pivotally connected to each of the pair of upper arm members, and each of the pair of forearm members are connected to each other at the common elbow joint by an elbow link member pivotally connecting each of the pair of forearm members, and
    wherein the shoulder link member is connected to the drive section to pivot the shoulder link member to position the wrist at a given location with a predetermined skew relative to an axis of translation.

* * * * *